(12) United States Patent
Kerdiles et al.

(10) Patent No.: US 7,601,271 B2
(45) Date of Patent: Oct. 13, 2009

(54) PROCESS AND EQUIPMENT FOR BONDING BY MOLECULAR ADHESION

(75) Inventors: Sebastien Kerdiles, Saint-Ismier (FR); Carine Duret, Grenoble (FR); Alexandre Vaufredaz, Voiron (FR); Frédéric Metral, St. Quentin sur Isère (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 720 days.

(21) Appl. No.: 11/357,771

(22) Filed: Feb. 17, 2006

(65) Prior Publication Data

US 2007/0119812 A1    May 31, 2007

(30) Foreign Application Priority Data

Nov. 28, 2005   (FR)   .................................. 05 12008
Nov. 28, 2005   (FR)   .................................. 05 12009

(51) Int. Cl.
*C03C 15/00* (2006.01)
*B31B 1/60* (2006.01)

(52) U.S. Cl. .................... 216/34; 156/60; 257/E21.122

(58) Field of Classification Search .................. None
See application file for complete search history.

(56) References Cited

U.S. PATENT DOCUMENTS

| 4,883,215 A | 11/1989 | Goesele et al. ............... 228/116 |
| 5,236,118 A | 8/1993 | Bower et al. ................. 228/193 |
| 5,503,704 A | 4/1996 | Bower et al. ................. 156/281 |
| 7,387,944 B2 * | 6/2008 | Tong et al. ................... 438/455 |
| 2002/0076902 A1 | 6/2002 | Geusic ......................... 438/455 |
| 2004/0023468 A1 | 2/2004 | Ghyselen et al. |
| 2004/0060900 A1 | 4/2004 | Walhauer et al. ............... 216/2 |
| 2004/0222500 A1 | 11/2004 | Aspar et al. |
| 2004/0262686 A1 | 12/2004 | Shaheen et al. ............. 257/347 |
| 2005/0142875 A1 | 6/2005 | Yoo ........................... 438/687 |
| 2006/0240642 A1 | 10/2006 | Kerdiles ..................... 438/455 |

FOREIGN PATENT DOCUMENTS

| EP | 0 969 500 A2 | 1/2000 |
| EP | 0 971 396 A1 | 1/2000 |
| EP | 1 566 830 A1 | 8/2005 |
| FR | 2 868 599 | 10/2005 |
| WO | WO 0161743 A1 * | 8/2001 |
| WO | WO 2005/096369 A1 | 10/2005 |
| WO | WO 2006/020439 A2 | 2/2006 |

OTHER PUBLICATIONS

T. Suni et al., "Effects Of Plasma Activation On Hydrophilic Bonding Of Si And Si O₂", Journal of. Electrochemical Society, vol. 149, No. 6, pp. G348-G351 (2002).

(Continued)

*Primary Examiner*—Allan Olsen
(74) *Attorney, Agent, or Firm*—Winston & Strawn LLP

(57) ABSTRACT

The invention relates to a process for bonding by molecular adhesion of two substrates to one another during which the surfaces of the substrates are placed in close contact and bonding occurs by propagation of a bonding front between the substrates. The invention includes, prior to bonding, a step of modifying the surface state of one or both of the surfaces of the substrates so as to regulate the propagation speed of the bonding front. The surface can be modified by locally or uniformly heating or roughening the surface(s) of the substrate(s).

23 Claims, 4 Drawing Sheets

OTHER PUBLICATIONS

M. Wiegand et al., "Time-Dependent Surface Properties And Wafer Bonding Of $O_2$-Plasma Treated Silicon (100) Surfaces", Journal of. Electrochemical Society, vol. 147, No. 7, pp. 2734-2740 (2000).

X. Zhang et al., "Low-Temperature Wafer Bonding, Optimal $O_2$ Plasma Surface Pretreatment Time", Electrochemical and Solid-State Letters; vol. 7, No. 8, pp. G172-G174 (2004).

S. Lyer and A.J. Auberton-Herve ,"Silicon Wafer Bonding Technology For VLSI and MEMS Applications", IEE , pp. 20-81-Chapters 2, 3 and 4), (2002).

H. Rieutord, "Dynamics Of A Bonding Front", Physical Review Letters, PRL 94, pp. 236101-1-236101-4 (2005).

U, Gösele et al., "Wafer Bonding For Microsystems Technologies", Sensors and Actuators, vol. 74, pp. 161-168 (1999).

R. Stengl et al., "Bubble-Free Silicon Wafer Bonding in a Non-Cleanroom Environment", Japanese Journal Of Applied Physics, vol. 27, No. 12, pp. L2364-L2366 (1988).

R. W. Bower et al., "Low Temperature Direct Silicon Wafer Bonding Using Argon Activation", Jpn. J. Appl. Phys. vol. 3, Part 2, No. 5A, pp. L 527-L 528 (1997).

R. W. Bower et al., Mechanical Considerations For Direct Bonding Of Semiconductor Materials, Electrochemical Society Proceedings, vol. 95-7, pp. 107-115.

S. N. Farrens et al., "A Kinetics Study of the Bond Strength of Direct Bonded Wafers", J. Electrochemical Society, vol. 141, No. 11, pp. 3225-3230 (1994).

S. N. Farrens et al., "Chemical Free Room Temperature Wafer To Wafer Direct Bonding", J. Electrochemical Society, vol. 142, No. 11, pp. 3949-3955 (1995).

U. Gosele et al., "History and Future of Semiconductor Wafer Bonding", Solid State Phenomena, vol. 47-48, pp. 33-44 (1996).

U. Gosele et al., "Self-propagating room-temperature silicon wafer bonding in ultrahigh vacuum", Appl. Phys. Lett., vol. 67,(24), pp. 3614-3615 (1995).

U. Gosele et al., "Wafer Bonding: A Flexible Approach to Materials Integration", pp. 20-25, The Electrochemical Society Interface, Summer (2000).

C. Gui et al., "Present and Future Role of Chemical Mechanical Polishing in Wafer Bonding", J. Electrochemical Society , vol. 145, No. 6, pp. 2198-2204 (1998).

Jan Haisma et al., XP-002264934, "Diversity and feasibility of direct bonding: a survey of a dedicated optical technology", Applied Optics, vol. 33, No. 7, pp. 1154-1169 (1994).

Jan Haisma et al., "Surface Preparation And Phenomenological Aspects Of Direct Bonding", Philips Journal of Research, vol. 49, No. 1/2 (1995).

J.B. Lasky, "Wafer bonding for silicon-on-insulator technologies", Appl. Phys. Lett., vol. 48,(1), pp. 78-80 (1986).

B.H. Lee, "A Novel Pattern Transfer Process for Bonded SOI Gigabit DRAMs", Proceedings 1996 IEEE International SOI Conference (1996).

Y. Albert Li et al., "Low Temperature Copper to Copper Direct Bonding", Department of Electrical and Computer Engineering, Univ. of CA, Davis, CA Fairchild Semiconductor Corp, 1322 Crossman Avenue, Sunnyvale, CA.

Y. Albert Li et al., "Systematic Low Temperature Silicon Bonding using Pressure and Temperature", Jpn. J. Appl. Phys. Lett., vol. 37,(24), Part I, No. 3A, pp. 737-741 (1998).

Karin Ljungberg et al. , "Phenomenology of Silicon Wafer Bonding", pp. 1-58, Comprehensive Summaries of Uppsala Dissertations from the Faculty of Science and Technology 166, Acta Universitatis Upsaliensis, Uppsala 1995.

Gertrud Kräuter et al, "Low temperature silicon direct bonding for application in micromechanics: bonding energies for different combinations of oxides", Sensors and Actuators A, vol. 70, pp. 271-275 (1998).

W. P. Maszara, "Role of surface morphology in wafer bonding", J. Appl. Phys., vol. 69, No. 1.1.. pp. 257-260 (1991).

W. P. Maszara, Reviews: "Silicon-On-Insulator by Wafer Bonding: A Review", J. Electrochemical Society, vol. 138, No. 1, pp. 341-347 (1991).

Kiyoshi Mitani et al., "Causes and Prevention of Temperature-Dependent Bubbles in Silicon Wafer Bonding", Japanese Journal Of Applied Physics, vol. 30, No. 4, pp. 615-622 (1991).

K. Mitani et al., "Formation of Interface Bubbles in Bonded Silicon Wafers: A Thermodynamic Model", Applied Physics A, vol. 54, pp. 543-552, (1992).

Andreas. Plooβi et al., "Covalent Silicon Bonding At Room Temperature In Ultrahigh Vacuum", Mat. Res. Soc. Symp. Proc., vol. 483, pp. 141-146 (1998)).

M. Shimbo et al., "Silicon-to-silicon direct bonding method", J. Appl. Phys., vol. 60,(8), pp. 2987-2989 (1986).

G.A.C.M. Spierings et al., "Surface-Related Phenomena In The Direct Bonding Of Silicon And Fused-Silica Wafer Pairs", , Philips Journal of Research, vol. 49, No. 1/2 pp. 47-63, (1995).

R. Stengl et al, "A Model for the Silicon Wafer Bonding Process", Japanese Journal of Applied Physics, vol. 28, No. 10, pp. 1735-1741 (1989).

G.-L Sun et al., "Cool Plasma Activated Surface In Silicon Wafer Direct Bonding Technology", Colloque C4, supplement au n°9, Tome 49, pp. C4-79-C4-80 (1988) Microelectronics Center, Nanjing Institute of Technology, Nanjing 210018, China.

Hideki Takagi et al., "Effect of Surface Roughness on Room-Temperature Wafer Bonding by Ar Beam Surface Activation", Jpn. J. Appl. Phys. Lett., vol. 37,, Part I, No. 7, pp. 4197-4203 (1998).

Q.-Y. Tong et al., "A Model of Low-Temperature Wafer Bonding And Its Applications", J. Electrochemical Society , vol. 143, No. 5, pp. 1773-1779 (1991).

Q.-Y. Tong et al., "A Simple Chemical Treatment for Preventing Thermal Bubbles in Silicon Wafer Bonding", J. Electrochemical Society , vol. 142, No. 10, pp. L201-L203 (1995).

Q.-Y. Tong et al., XP-002453642, "Low Temperature Wafer Direct Bonding", Journal Of Microetectromechanical Systems, vol. 3. No. 1, pp. 29-35 (1994).

Q.-Y. Tong et al., Invited Review: "Semiconductor wafer bonding: recent developments", Materials Chemistry and Physics, vol. 37, pp. 101-127 (1994).

M. K. Weldon, "Physics and chemistry of silicon wafer bonding investigated by infrared absorption spectroscopy", J. Vac. Sci. Technol. B 14(4), pp. 3095-3106 (1996).

C. Zhang et al., "The Effect of $Al_{0.7}Ga_{0.3}$ As Etch Stop Removal on the Preparation of Wafer-Bonded Compliant Substrates", Journal of The Electrochemical Society, 146(4), pp. 1597-1601 (1999).

A. Plöβi et al. "Wafer Direct Bonding: Tailoring Adhesion Between Brittle Materials", Materials Science and Engineering, R25, Nos. 1-2, (1999).

* cited by examiner

1

2

3

4

PROCESS AND EQUIPMENT FOR BONDING BY MOLECULAR ADHESION

BACKGROUND

The field of the invention is that of bonding two substrates to one another by molecular adhesion. The invention generally concerns a process and bonding equipment. It extends likewise to the formation of a structure comprising a thin layer made of a semiconductor material upon a support substrate. To form such a structure, the typical procedure is to place a donor substrate in close contact with the support substrate, so as to effect bonding by molecular adhesion of the substrates to one another. This is then followed by the transfer of a part of the donor substrate to the support substrate to form the thin layer on the support substrate.

Bonding by molecular adhesion (either 'direct wafer bonding' or 'fusion bonding') is a technique that enables two substrates having perfectly flat surfaces (e.g., polished mirror surfaces) to adhere to one another, without the application of adhesive (gum type, glue, etc.). The surfaces in question are generally those of substrates made of an insulating material (for example, quartz or glass) or a semiconductor material (for example Si, GaAs, SiC, Ge, etc). Bonding is typically initiated by local application of light pressure to the two substrates when they are placed in close contact. A bonding front then spreads over the entire extent of the substrates in a few seconds.

The bonding energy obtained at ambient temperature is generally low enough relative to that observed between two solids in covalent, ionic or metallic connection. For numerous applications, however, bonding is reinforced by carrying out thermal annealing. In the case of a silicon surface molecularly bonded to another silicon or silicon oxide surface, the bonding energy reaches a maximum after a bonding reinforcing annealing carried out at temperatures on the order of 1100° C. to 1200° C.

In addition, to obtain satisfactory bonding of two substrates, the typical procedure prior to bonding is the preparation of one or both of the surfaces to be bonded together. Enhanced bonding is intended to increase the mechanical performance of the bonded substrates or to boost the quality of the bonding interface.

An example of such a treatment for increasing the mechanical behavior between the substrates during bonding is the preparation of the surfaces to be bonded with the aim of making them more hydrophilic. Within the scope of hydrophilic bonding, the following properties are preferred for the surfaces to be bonded:

the absence of particles;
the absence of hydrocarbons;
the absence of metallic contaminants
a low surface roughness, typically less than 5 Å RMS;
strong hydrophily, that is, a substantial density of Si—OH silanol bonds terminating the surfaces to be bonded together.

The preparation of the surfaces to be bonded is generally completed by utilizing one or more chemical treatments. By way of example of chemical treatment prior to (hydrophilic) adhesion, the following can be mentioned:

cleaning of RCA type, namely the combination of a SC1 ($NH_4OH$, $H_2O_2$, $H_2O$) bath adapted to shrinkage of the particles and the hydrocarbons and a SC2 (HCl, $H_2O_2H_2O$) bath adapted to shrinkage of the metallic contaminants;

cleaning with an ozone solution ($O_3$) adapted to shrinkage of the organic contaminants;

cleaning with a solution containing a mixture of sulfuric acid and oxygenated water (or SPM solution, Sulfuric Peroxide Mixture).

The preparation of the surfaces to be bonded can likewise comprise mechanical preparation of the surfaces (light polishing, brushing), either alone or in combination with the chemical treatment.

As a complement to conventional methods of bonding by molecular adhesion, strong bonding techniques at low temperature have been developed more recently to make heterostructures (two materials of different types) more readily adhere to substrates comprising partially or totally manufactured electronic components (aka patterned substrate and structured wafer), or even for adhering substrates that are capable of being altered during annealing at high temperatures. Bonding by molecular adhesion with plasma activation is an example of such a strong bonding technique that can be carried out at low temperature. Exposure of one or both surfaces to a plasma prior to bonding allows strong bonding energy to be reached after relatively short reinforcing annealing of the structure (around 2 hours) at a relatively low temperature (typically less than 600° C.). As a reference for this teaching, the following articles can be mentioned:

"Effects of plasma activation on hydrophilic bonding of Si and $SiO_2$" T. Suni et al., J. Electroch. Soc, Vol. 149. No. 6, p. 348 (2002);

"Time-dependent surface properties and wafer bonding of $O_2$-plasma treated silicon (100) surfaces", M. Wiegand et al., J. Electroch. Soc. Vol. 147, No. 7, p. 2734 (2000).

It is evident that the different techniques for surface preparation mentioned earlier systematically incorporate at least one humid stage, that is, at least rinsing of the surfaces by deionized water. The substrates are then dried, for example by centrifuging (dry spin). As a function of their degree of hydrophily, the surfaces of the substrates have, after drying, several monolayers of adsorbed water, with these monolayers being at the origin of the intermolecular forces responsible for adhesion during contacting of the surfaces.

Also, bonding by molecular adhesion of substrates to one another generally causes defects. Notable examples of such defects include defects of the bubble type (or bubbles) at the level of the bonding interface between the two substrates, as well as defects of edge type (or edge voids) at the level of the thin layer of the final structure (the thin layer on support substrate that is obtained after transfer). Bubbles are understood to be defects that result from gas and/or water combining at the bonding interface between the two substrates. Bubbles can appear after the application of a low budget thermal to the adhered structure (for example after application of thermal annealing at 200° C. over 2 hours) and are observable by inspection of the bonding interface using an infrared camera, or by acoustic microscopy. The bubbles will be responsible for the presence of non-transferred zones at the level of the final structure obtained after transfer. The article "Low-Temperature Wafer Bonding, Optimal $O_2$ Plasma Surface Pretreatment Time", by X. Zhang and J-P. Raskin in Electrochemical and Solid-State Letters, 7 (8) G172-G174 (2004), illustrates the phenomenon of the formation of bubbles at the bonding interface. Edge voids are understood to mean defects which result from bonding and which are typically observed at the periphery of the final structure (generally in the form of a circular plate).

An application of direct bonding is that carried out within the scope of producing structures of the Semiconductor On Insulator or SeOI type, and in particular for Silicon On Insulator or SOI structures. Included within this scope of this invention are substrates to be bonded where at least one has a surface layer of oxide; by way of example, Si/SiO$_2$ bonding or SiO$_2$/SiO$_2$ bonding which are typically undertaken to form a SOI structure.

There are three main methods for producing SeOI structures by direct bonding: to well known SMART-CUT® process, or the so-called BSOI (and BESOI) or ELTRAN® processes. A description of the processes associated with each of these methods can be found in the text entitled 'Silicon wafer bonding technology for VLSI and MEMS applications', by S. S. Lyer and A. J. Auberton-Hervé, IEEE (2002). Despite the accepted use of these processes, defects of the edge voids type, cause by the bonding step, can often appear after transfer of the thin layer from the donor substrate to the support substrate.

As is schematically illustrated in FIG. 1 in terms of forming a SOI structure, an edge void P is a hole (of a diameter typically between 100 μm and 1 mm) in the thin transferred layer which corresponds to a zone of the donor substrate not transferred to the support substrate A. The edge voids appear most often at the edge (peripheral zone) of the "thin layer on support substrate" structure (circular wafer); and they are usually located at a distance of typically between 1 mm and 5 mm of the wafer edge.

The edge voids are macroscopic defects connected to poor bonding at the edge of the wafers. They can be killer defects because, in the absence of a thin layer acting as an active layer for the formation of electronic components at the location of an edge void, no component can be manufactured at this location. Given the size of the edge voids, an electronic component comprising at least one edge void is necessarily defective.

In addition, a transfer process of the SMART-CUT® type is notably interesting in that it allows for recycling of the donor substrate. So when adhesion of a recycled donor substrate is completed (that is, a donor substrate already having served for removal and transfer of a thin layer; known as 'refresh' wafer), a greater number of edge voids is observed than when bonding of an original donor substrate is completed (i.e., one having never served to remove and/or transfer of a thin layer; known as 'fresh' wafer). This increased presence of edge voids tends to prohibit the recycling of such wafers, thus defeating one of the main reasons for using the SMART-CUT® process.

Since the presence of edge voids induces losses in terms of quality and yield, there is thus a need to prevent the formation of such defects. It has been proposed in European patent application EP 1 566 830 to limit the number of defects of void type at the edge of a SOI wafer obtained as a result of molecular bonding. According to this application, these defects are always located at a specific position relative to the center of the wafer, and seem to be due to the configuration of the edges of wafers. Therefore, to decrease the number of defects, this application proposes modifying the configuration of wafer edges during manufacture. More precisely, this application proposes modifying the curve of the edge drops, in regions ranging from 3 mm to 10 mm from the periphery of the wafer. This solution thus has the disadvantage of requiring previous mechanical intervention on the wafers.

Another application of direct bonding is that of Si/Si bonding of DSB type (Direct Si Bonding). As mentioned earlier, defects of bubble type are all the same capable of appearing at the bonding interface. One solution for reducing the formation of bubbles in this process consists of producing plasma activation of the surfaces to be bonded, so as to obtain good adhesion energy, but this solution has not been found to be entirely satisfactory for reducing the number of bubbles at the bonding interface.

Thus, improvements in these type processes are desired and necessary.

SUMMARY OF THE INVENTION

The present invention provides bonding techniques that rectify the disadvantages of the state of the art. The invention generally relates to a method for bonding two substrates together by molecular adhesion of their surfaces which comprises preparing the surfaces of the substrates with a flatness sufficient to facilitate bonding by propagation of a bonding front when the surfaces of the substrates are placed in contact with each other, modifying the surface of one or both of the substrates sufficiently to regulate propagation speed of the bonding front to reduce bubble or voids between the substrates after bonding. Enhanced bonding can be achieved by modifying the surface(s) to decrease water adsorbed thereon. Thereafter, the surfaces of the substrates can be placed in contact together to effect bonding with the modified surface (s) providing a sufficiently reduced speed of the bonding from to reduce the number of bubbles or void defects therebetween compared to bonding with non-modified substrate surfaces.

Various ways can be used to modify the surface of one or both of the substrates, including: heating all or a portion of the surface(s), preferably by conduction from a heated plate or from infrared lamps or by forming a rough layer on the surface(s) according to different techniques. It is also possible to conduct plasma activation after the surface(s) modifying step to further enhance bonding. These various procedures are defined in the following detail description.

BRIEF DESCRIPTION OF THE DRAWING FIGURES

Other features and advantages of the present invention will emerge more clearly from reading the following detailed description of preferred embodiments, given by way of non-limiting examples, and done in reference to the attached drawings, in which.

Figure 4:
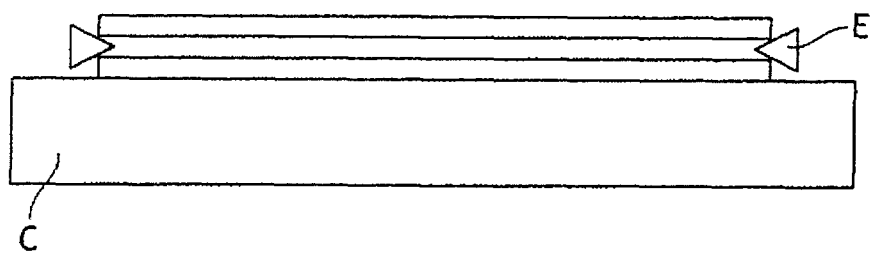
Figure 5:
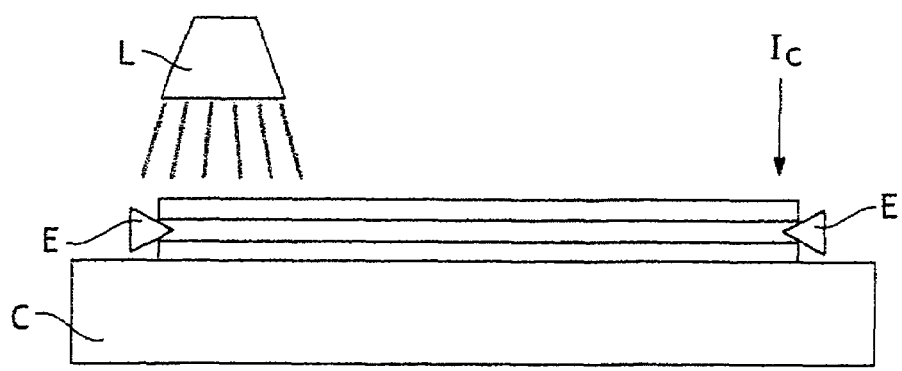
Figure 6:
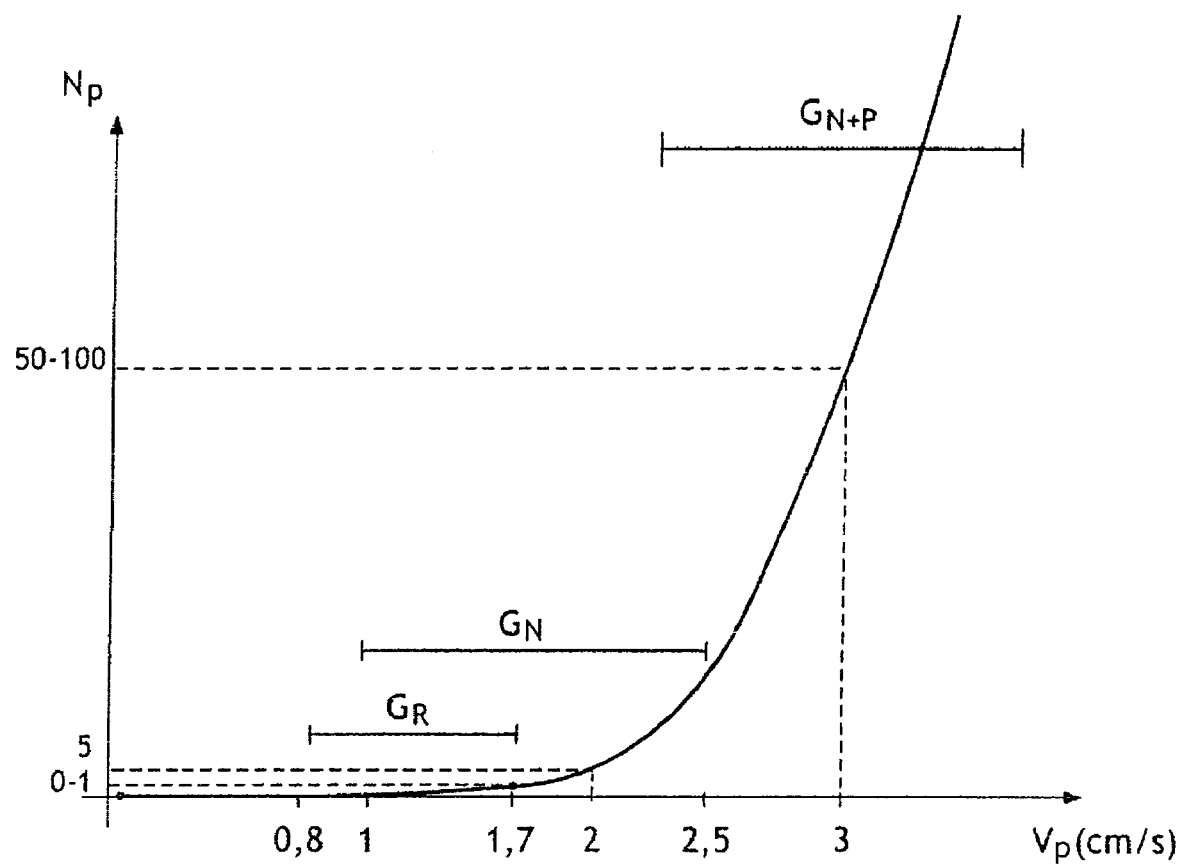
Figure 7:
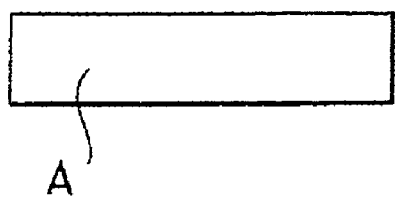
Figure 7:
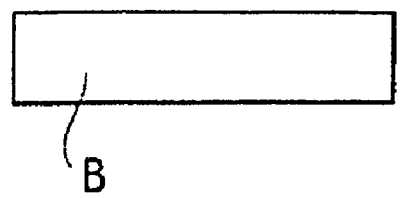
Figure 7:
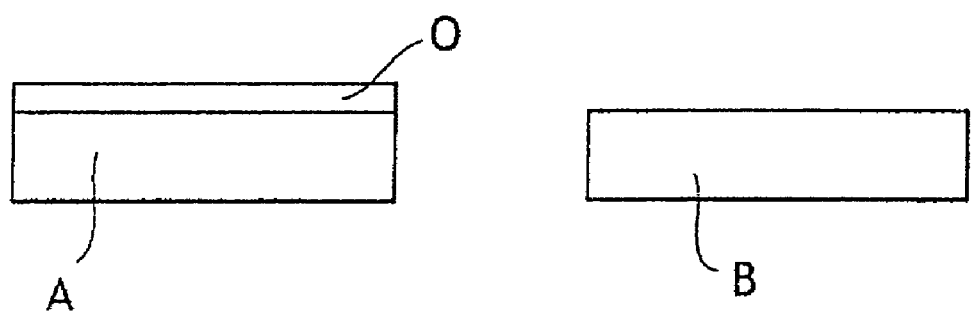
Figure 7:
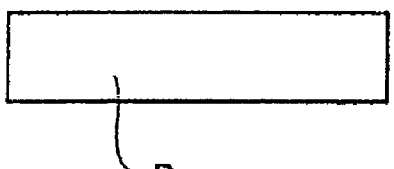
Figure 7:
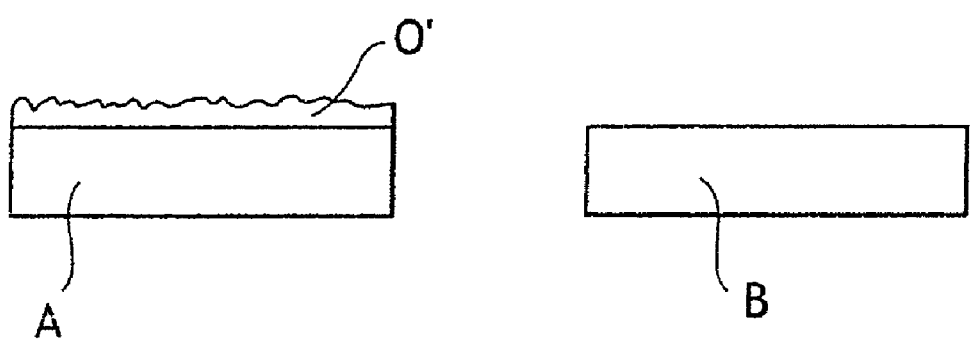
Figure 7:
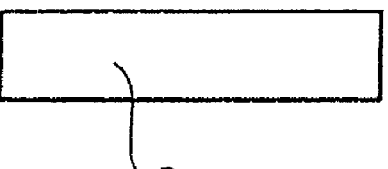
Figure 7:
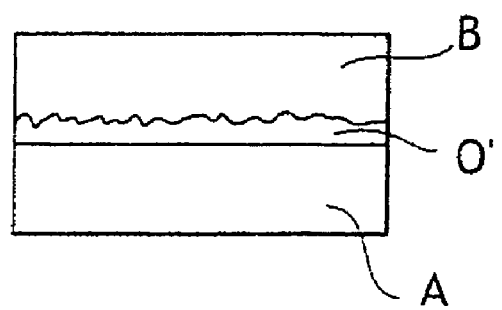

FIGS. 4 and 5 respectively show uniform heating and localized heating of two substrates to be placed in close contact to bring about their bonding by molecular adhesion;

FIG. 6 is a diagram illustrating the formation of edge voids as a function of the propagation speed of the bonding front;

FIG. 7 is a diagram showing an embodiment of the bonding process according to the first aspect of the invention.

DETAILED DESCRIPTION OF THE PREFERRED EMBODIMENTS

As noted above, the invention concerns a bonding process by molecular adhesion of two substrates to one another, during which the surfaces of the substrates are placed in close contact and bonding occurs by propagation of a bonding front between the substrates, which comprises, prior to bonding, a step consisting of modifying the surface state of one or both of the substrates so as to regulate the propagation speed of the bonding front.

Certain preferred, though non-limiting, aspects of this embodiment are the following:

modification of the surface state is a decrease in the thickness of a layer of water adsorbed on the surface of one or both of the substrates to be bonded;

modification of the surface state is completed by heating;

heating is applied before the substrates are placed in close contact with one another and at least until initiation of bonding;

heating is effected over a period of between 1 and 90 seconds, preferably for 30 seconds;

heating is effected by thermal conduction via transmission of heat from a plate supporting one of the substrates to be bonded, with the same or preferably separate plates used for heating each substrate;

heating is effected by radiation from a lamp lighting one of the substrates to be bonded;

the lamp is a lamp radiating in the infrared range, preferably with a wavelength of between 0.8 µm and 5 µm;

heating is effected at a temperature of between about 30° C. and 90° C.; preferably between about 50° C. and 60° C.;

heating can applied uniformly over the entire surface of the substrate to be bonded; or heating is applied locally at a peripheral zone of the substrate to be bonded;

adhesion is initiated in the center of the substrates, with the heated peripheral zone covering the entire circumference of the substrate to be bonded;

adhesion is initiated at the edge, with the heated peripheral zone defining an arc of a circle diametrically opposed to the edge of initiation and limited by an angle at the center of around 120°;

before bonding and following the modification stage of the surface state, the process comprises a stage of plasma activation of one or both of the surfaces to be bonded.

Rather than heating, additional techniques can be used to modify the surface(s) of the substrate to be bonded. Certain aspects, again preferred though non-limiting, of this second embodiment of this process are the following:

modification of the surface state is effected by roughing the surface:

the modification step of the surface state includes forming a rough surface layer on one or both of the substrates to be bonded;

to form the rough layer, the process comprises a thermal oxidation operation of one or both of the substrates so as to form a thermal oxide layer thereon and an operation for treating the thermal oxide layer adapted to etch the oxide layer:

treatment of the thermal oxide layer can be accomplished by other chemical treatments rather than etching;

the layer of thermal oxide is a layer of $SiO_2$ and the chemical treatment is SC1 treatment conducted at a temperature of between 50° C. and 80° C. over a period of longer than three minutes, preferably over 10 minutes;

to form the rough layer, the process comprises an operation for depositing a surface layer of oxide on the surface(s) of one or both of the substrates;

the surface layer to be deposited is a layer of TEOS oxide, a layer of LTO oxide, or a layer of nitride;

for further enhancement of bonding, the process includes, before bonding and after the modification step of the surface(s), a plasma activation stage of one or both of the surfaces to be bonded.

Another aspect of the invention relates to equipment for bonding by molecular adhesion the two substrates to one another. Such equipment typically includes means for modifying, prior to bonding, the surface(s) of one or both of the substrates so as to regulate the propagation speed of the bonding front. In particular, heating means can be used to raise and control the temperature of one or both of the substrates before bonding.

The invention also concerns, under another aspect, a process for formation of a structure comprising a thin layer made of a semiconductor material on a support substrate, comprising the steps of placing in close contact a donor substrate, for example a 'refresh' substrate originating from recycling, with the support substrate so as to carry out bonding by molecular adhesion of the substrates to one another following the propagation of a bonding front between the substrates, and transfer of part of the donor substrate to the support substrate so as to form the thin layer on the support substrate, characterized in that it comprises prior to bonding a step consisting of modifying the surface state of the donor substrate and/or of the support substrate so as to regulate the propagation speed of the bonding front. And the invention extends of course to the "thin layer on support substrate" structures obtained from implementing this process.

According to the first aspect, the invention concerns a process of bonding by molecular adhesion of two substrates to one another, during which the substrates are placed in close contact and bonding occurs by propagation of a bonding front between the substrates. It is understood that the invention is not limited to bonding by molecular adhesion of two substrates to one another, but extends likewise to the formation of a structure comprising a thin layer of semi-conductor material on a support substrate, during which bonding by molecular adhesion is carried out of a donor substrate with the support substrate, followed by transfer of the thin layer from the donor substrate to the support substrate.

As mentioned earlier, the SMART-CUT®, BSOI (and BESOI), and ELTRAN® processes are examples of processes that use bonding by molecular adhesion for transferring useful layers. According to the SMART CUT® process, prior to bonding an embrittlement zone (or zone of weakness) is formed by implantation of atomic or ionic species in the thickness of the donor substrate, and after bonding detachment of the donor substrate is made at the embrittlement zone to transfer the thin layer to the support substrate. To carry out molecular adhesion, typical procedure is to place the donor substrate and the support substrate in close contact, then to initiate bonding by local application of light pressure on the two substrates placed in close contact. A bonding front then spreads over the entire extent of the substrates.

The origin of the defects resulting from bonding is not determined with certainty these days. Analysis shows that within the scope of Si/Si DSB type bonding, the bubble-type defects appear more particularly since no oxide layer (other than native oxide) is present at the surface of the substrates to be bonded. The applicant estimates in effect that in the case of adhesion with the presence of a layer of oxide (for example for $Si/SiO_2$ bonding, such as in view of formation of a SeOI structure), the water and gas encapsulated during bonding or appearing later (for example during thermal consolidation treatment of the bonding) preferably diffuse in the oxide layer and are thus less inclined to diffuse to the bonding interface. However, in the case of DSB bonding, in the absence of such a layer of oxide, it is believed that the water and the gas encapsulated during bonding or appeared consequently have a tendency to diffuse to the bonding interface, where they will combine to form bubbles.

Figure 1:
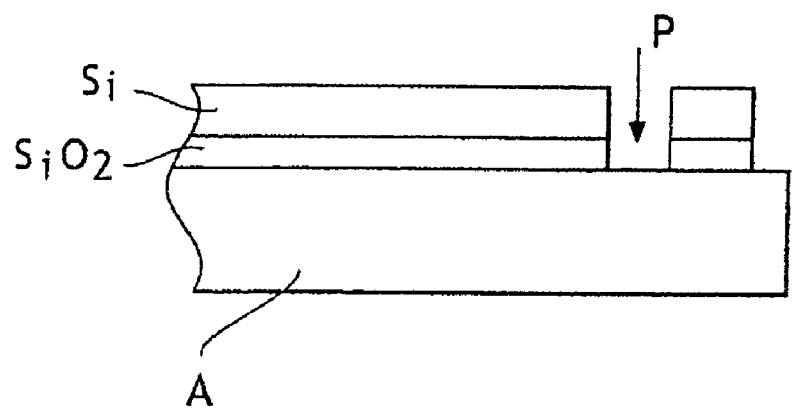
FIG. 1 is a schematic illustration of a method of forming a SOI structure as known in the art.
Figure 2:
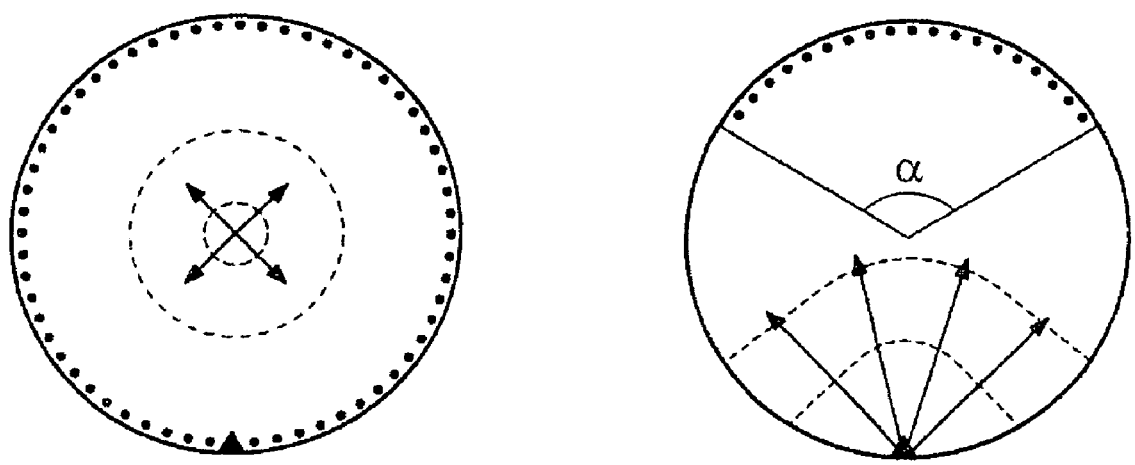
FIG. 2 illustrates the formation of edge voids as a function of the location of the point of initialization of adhesion.

With respect to the edge void-type defects, analysis shows that these are defects that form with closing of the space between the surfaces during bonding, and in particular where the bonding front meets the edge of the bonded substrates. The illustrations of FIG. 2 show analysis results concerning the formation of edge voids. In FIG. 2, the arrows represent the direction of propagation of the bonding front, the pointed lines represent the position of the bonding front at different instants, and the points represent the edge voids. As is illustrated to the left in FIG. 2, it has been determined that when bonding is initiated at the center of the surfaces (by local application of pressure, for example), edge voids are potentially found over the entire periphery of the support substrate. However, as illustrated on the right of FIG. 2, when bonding is initiated on board the wafer (typically at the level of a recess known as a 'notch' made on board the wafer to facilitate its manipulation), edge voids can appear in a peripheral zone of the support substrate describing an arc of a circle diametrically opposed to the point of initiation, limited by an angle at the center of around 120°.

In general, the present invention limits or even prevents the formation of defects caused by bonding by regulating the propagation speed of the bonding front. 'Regulate' is understood to mean to control, maintain and conserve the command of evolution of a phenomenon. Within the scope of the present invention, the phenomenon is that of propagation of the bonding front, and evolution of the phenomenon corresponds to the propagation speed of the bonding front. The speed of propagation is more precisely regulated so as to be reduced relative to the speed usually observed in the absence of such control. To allow regulation of the propagation speed of the bonding front, the present process includes carrying out, prior to bonding, a modification step of the surface of one or both of the surfaces to be bonded.

This modification step is conducted after the surfaces of the substrates are flattened and prepared for molecular bonding immediately prior to contacting the surfaces together to initiate bonding. The modification step is primarily intended to remove water or water layers from one or both of the surfaces to facilitate bonding, but it does not significantly detract from the surface preparation steps or steps. While the modification step also slightly reduces the speed of propagation of the bonding front, it does not prevent such front from proceeding or otherwise inhibit molecular bonding. It was unexpected to find that such a modification step would reduce bubbles or voids while not hindering the molecular bonding of the substrates, since it is known in the art to prepare such surfaces to be as smooth as possible to facilitate the bonding step. Rather than preserving such smooth surfaces for bonding, the application of heat or minor roughening of the substrate surfaces immediately prior or directly before bonding according to the present invention now provides a measurable reduction or elimination of bubble or edge void defects.

According to a first embodiment, this means in particular to control the quantity of water adsorbed at the surface, and more precisely to decrease, without completely eliminating all the same, the thickness of the layer of water adsorbed relative to the thickness of the layer of water normally adsorbed. In other terms, this means to reduce the number of monolayers of water adsorbed at the surface. Bonding by molecular adhesion is also known as direct bonding, because it concerns bonding not requiring the application of an adhesive (of gum or other glue type). It is really the water adsorbed on each of the surfaces (several monolayers of water) and placed in contact which acts as adhesive and ensures adhesion by means of Van der Waals force. For this reason, it was previously considered that several monolayers of water must be present on the surface in order to obtain good molecular bonding.

Within the scope of this first embodiment, the surface state of a substrate is modified, and the propagation speed of the bonding front is thus regulated, by playing with the temperature of the substrate surface(s) prior to bonding. Bonding by molecular adhesion is classically carried out at ambient temperature (20° C. to 25° C.), whether in the case of manual bonding or in the case of automatic bonding. In contrast, it has been found that edge voids and bubbles can be partially or totally eliminated when the substrates are pre-heated before and up until being placed in close contact. The heating actually causes modification of the surface state of the substrates placed in contact, enabling the propagation speed of the bonding front to be reduced. By controlling this heating, it is possible to regulate the propagation speed of the bonding front, that is, to control the reduction in the propagation speed of the bonding front. And while this step removes some of the layers of water from the surfaces to be bonded, it allows sufficient water to remain so that molecular bonding can occur, with only a slight reduction in the propagation speed on the bonding front but a significant reduction of defects in the bonded substrate assembly.

FIG. 6 illustrates a curve showing the number of edge voids Np observed after transfer as a function of the propagation speed of the bonding front Vp (expressed in centimeters per second) for Si on $SiO_2$ bonding. FIG. 6 is only given by way of illustration. In addition, the different numerical examples obviously depend on the substrates utilized for adhesion (substrate originating from recycling 'refresh substrate', or not, 'fresh substrate'; type of material comprising the substrate, in particular its flexibility, etc.).

For low bonding speeds (typically less than 1.7 cm/s), no edge voids have been encountered. For a speed of 1.7 cm/s, between 0 and 1 edge voids are observed. The number of edge voids then increases rapidly when the propagation speed of the bonding front rises. Thus, 5 edge voids can be counted at a speed on the order of 2 cm/s and between 50 and 100 edge voids for a speed of the order of 3 cm/s.

When standard cleaning only of the substrates to be bonded is carried out prior to bonding (for example RCA), the overall propagation speed of the bonding front is found to be between 1 cm/s and 2.5 cm/s ($G_N$ range in FIG. 6). On average, there are no edge voids observed on all structures obtained after transfer when bonding is completed following RCA cleaning. But certain structures have a significant number of edge voids; these typically are those for which the bonding front has propagated at a speed greater than 1.7 cm/s.

It should be mentioned here that good bonding energy and rapid propagation of the bonding front are generally associated. U.S. Pat. No. 6,881,596 proposes to determine the quality of the bonding interface by measuring the propagation speed of the bonding front. The article "Dynamics of a Bonding Front" by Rieutord, Bataillou and Moriceau in Physical Review Letters, PRL 94, 236101 proposes a formula (see equation 5) indicating that the propagation speed increases if the bonding energy augments. And as already mentioned above, plasma activation can have been carried out as a complement to standard RCA cleaning. This plasma activation focuses especially on increasing the bonding energy.

It has been found that the propagation speed is more significant after plasma activation of the substrates to be bonded. FIG. 6 schematically illustrates the propagation speed within the scope of RCA cleaning treatment and plasma activation (here activation of only one of the surfaces to be bonded). As can be noted, the increase in propagation speed is accompanied by the formation of a significant number of edge voids (see $G_{N+P}$ range in the figure).

With reference to the description of the invention, prior to bonding the surface state of one or both of the substrates to be bonded is modified so as to regulate the propagation speed of the bonding front. Within the scope of the example in FIG. 6, this regulation is provided so that the speed of the bonding front is in the $G_R$ range (typically above 0.6 cm/s and below 2 cm/s and preferably between 0.8 cm/s and 1.7 cm/s; or an overall bonding time of between 18 and 35 seconds for substrates in the form of wafers of 300 mm in diameter) so as to prevent the formation of edge voids.

A first application to be made of regulation by heating concerns the formation of a SeOI structure following bonding of two substrates, whereof one at least has a surface oxide layer. In fact, by reducing the speed of the bonding front, better-quality bonding (in particular on the edge of the wafer) can be obtained, thus preventing the non-transfer of certain zones of the donor substrate to the support substrate and consequently the formation of edge voids. It has been found that by using such hot contact, no edge voids are observed, whereas as many as 80 to 100 edge voids can be counted on SOI structures originating from bonding by being placed in contact at ambient temperature. It will be noted that obtaining this good-quality bonding enables recycling, that is, the utilization of substrates of the refresh type.

Within the scope of this first application, heating is conducted at a temperature of between 30° C. and 90° C., preferably between 50° C. and 60° C. This temperature range results from a compromise between the appearance of edge voids at a temperature close to 25° C. (ambient temperature) and observation of a drop in bonding energy at excessive temperature. If the substrates are heated to an excessive temperature, a majority of the water adsorbed at the surface (even all of it) will evaporate, and the bonding force risks dropping sharply. Other types of defects are capable of being caused by excessively low bonding energy. At the extreme, molecular adhesion may not even be produced.

To illustrate the drop in bonding energy, reference can be made to the article by Suni et al. in J. Electrochem. Soc. Vol. 149 No. 6 pp. 348 to 351, 2002, entitled "Effects of Plasma Activation on Hydrophilic Bonding of Si and $SiO_2$", in which it is mentioned that the bonding energy drops from 2.5 $J/m^2$ (case of bonding at ambient temperature) to 1 $J/m^2$ (case of bonding conducted at 150° C.), all this after bonding reinforcing annealing carried out at 200° C. Within the scope of this first application, the invention proposes to use the lowest of the temperatures allowing the edge voids to disappear, so as not to cause a harmful drop in bonding energy.

With reference to the specific example in FIG. 6, the aim is a propagation speed of the bonding front of not less than 0.8 cm/s so as not to cause a harmful drop in the bonding energy, and in any case less than 1.7 cm/s to avoid the formation of edge voids. Therefore, irrespective of the surface preparations made prior to bonding, the aim here is a speed in the $G_R$ range, especially by reducing this speed by heating, in a controlled manner. Mention is made that plasma activation can likewise be utilized within the scope of regulating the speed of the bonding front, with plasma activation effectively causing acceleration of the propagation of the bonding front (or an increase in the propagation speed).

A first variant of this first possible embodiment consists of uniformly heating the whole of one or both of the substrates to be bonded. A second variant comprises conducting localized heating of one or both of the substrates to be bonded, limited to the zone where the edge voids might disappear. As discussed hereinabove with respect to FIG. 2, this is about the termination zone of the bonding front, localization and the extent of this zone depending on the manner in which bonding has been initiated.

Accordingly, when the bonding of two circular substrates is initiated at the center, the invention proposes heating the entire peripheral zone (that is, all of the circumference of the substrate). By way of purely illustrative example, this peripheral zone can be considered as occupying a peripheral band of 50 mm wide from the edge of a wafer 300 mm in diameter.

However, when the bonding of two circular substrates is initiated at the edge, the invention advantageously proposes to heat only the edge diametrically opposite to this point (in particular the peripheral zone delimited by an angle at the center of around 120°). By employing localized heating, the bonding front is uniquely slowed locally. This prevents the formation of edge voids without the rest of the bonding (non-heated zone) being altered and undergoing a loss in terms of bonding energy.

The heating (whether localized or extended to all of one or both of the substrates) can be carried out by thermal conduction. There can be provision for the plate on which repose one of the substrates to be bonded ("chuck" plate) to transmit its heat. It can also be provided that heating is carried out by radiation, for example by using one or more halogen lamps illuminating all or part of the substrates to be heated.

Heating is completed before the surfaces to be bonded (the substrates then typically being placed opposite, separated by a few millimeters by means of spacers) are placed in close contact and at least until initiation of bonding (the substrates then having been placed in close contact). In particular, heating is carried out such that the zone where the edge voids are capable of appearing remains at the desired temperature until the substrates are adhered in this zone (by hypothesis, the water desorbed locally does not have to be able to condenser before the bonding is finished).

The duration of heating depends largely on the device utilized to raise then control the temperature of the heated zone. It is typically between 1 and 90 seconds. By way of example, with a 500 W halogen lamp, the duration of heating is typically between 30 and 90 seconds. It is noted that this time range likewise depends on other parameters, such as for example the distance between the lamp and the substrates.

The spectral distribution of the lamp utilized to heat and have the water desorbed is likewise a parameter influencing the duration of heating. In fact, a lamp mainly emitting light in the infrared mode (length of average wave around 3 μm, typically comprises between 0.8 μm and 5 μm) is particularly efficacious to effect desorption of water (the absorption band of the molecules of water are effectively close to 3 μm) and thus leads to ultrarapid heating, quasi-instantaneously decreasing the thickness of the layer of water adsorbed. In addition, the utilization of such infrared radiation helps to selectively heat the adsorbed water while heating the silicon wafer much less, a relatively transparent material in the infrared.

A second application from heating relates to carrying out adhesion of DSB type. Bubbles can be partially or totally eliminated within the scope of Si/Si adhesion of DSB type when the substrates are heated uniformly before and until they are placed in close contact. IR observations have thus shown a significant reduction, even that the bubbles have disappeared. This is believed to be due to the fact that heating in effect diminishes the thickness of the layer of water adsorbed at the surface of the substrates. The quantity of water (and/or gas) capable of diffusing at the bonding interface is now reduced, and this allows the appearance of bubbles at the bonding interface to be reduced or to completely disappear.

The previous discussion concerning the different ways of carrying out heating likewise applies to this second application, by noting all the same that uniform heating of one or both of the substrates to be bonded is preferably carried out here. DSB bonding can especially be utilized to create Si/Si bonding of substrates having different crystalline orientations, or again substrates having different doping, or even substrates having different levels of constraints. Following transfer of part of one of the substrates to the other, to form a thin layer there, 'thin layer on support substrate' structures are produced, for which the thin layer on one side and the support substrate on the other have different properties.

In order to enable regulation of the propagation speed of the bonding front, the invention proposes to carry out, prior to adhesion, a modification step of the surface state of one or both of the surfaces to be bonded. According to a second possible embodiment, the surface state of a substrate is modified by altering the surface roughness prior to bonding. This second embodiment is more particularly adapted to the formation of a SeOI structure for which an insulating layer is interposed between the thin layer and the support substrate (also known as a buried layer). This insulating layer is normally formed by thermal oxidation of the donor substrate and/or of the support substrate or again by depositing a layer of oxide on the surface of the donor substrate and/or of the support substrate.

This embodiment proves especially advantageous for the formation of a SeOI structure having an ultra thin insulating layer. In fact, it proves to be particularly difficult using techniques of the prior art to effect adhesion and/or transfer without defect with such a ultra thin layer interposed in between the thin layer and the support substrate. By ultra thin insulating layer, it is generally understood here a layer which thickness is less than 500 Å, even less than 200 Å. The propagation speed of the bonding front is sensitive to the surface state of the substrates put in contact. The different surface cleaning and/or treatment options made prior to bonding, but also the surface roughness, thus influence the rapidity with which the bonding front spreads. Within the scope of this second embodiment the surface roughness of a layer of oxide is controlled so as to regulate the propagation speed of the bonding front, that is, in such a way as to control the reduction in propagation speed of the bonding front. Since the bonding front is slowed, the result from this is a drop in the number of edge voids at the edge of the wafer.

A first variant to this second embodiment consists, prior to bonding, of modifying the surface state of a thermal oxide layer formed on the surface of one of the donor or support substrates and intended to form the buried layer by conducting 'aggressive' cleaning of the surface of the layer of oxide. This cleaning is to be carried out prior to any plasma activation. Of course, a thermal layer of oxide can be formed on each of the donor and support substrates and such 'aggressive' cleaning can be performed on one or both of the surfaces of the thermal oxide layers.

For example, in the case of formation of a SOI structure comprising a buried, ultra thin thermal oxide layer of the order of 250 Å to 500 Å (such a layer is known as 'Ultra Thin BOX'), adapted chemical treatment can be carried out so as to lightly etch the surface of the oxide layer. For example, SC1 treatment is applied according to conditions (temperature, duration) more significant than those respected during standard cleaning treatment. SC1 treatment can thus be applied within the scope of the invention at a temperature of between 50° C. and 80° C., for example of the order of 70° C., with a treatment duration greater than 3 minutes, for example of the order of 10 minutes.

FIG. 7 is a diagram illustrating the bonding process according to this variant to the first aspect of the invention. At stage 1, there are two substrates A and B. At stage B, procedure involves thermal oxidation of the substrate A to form a layer of oxide O at the surface of the substrate A. At stage 3, aggressive cleaning of the layer of oxide O is completed to obtain a rough layer O' at the surface of the substrate A. At stage 4, the substrates A and B are placed in close contact by way of the rough layer O', and bonding is initiated such that a bonding front spreads to the bonding interface.

Figure 3:
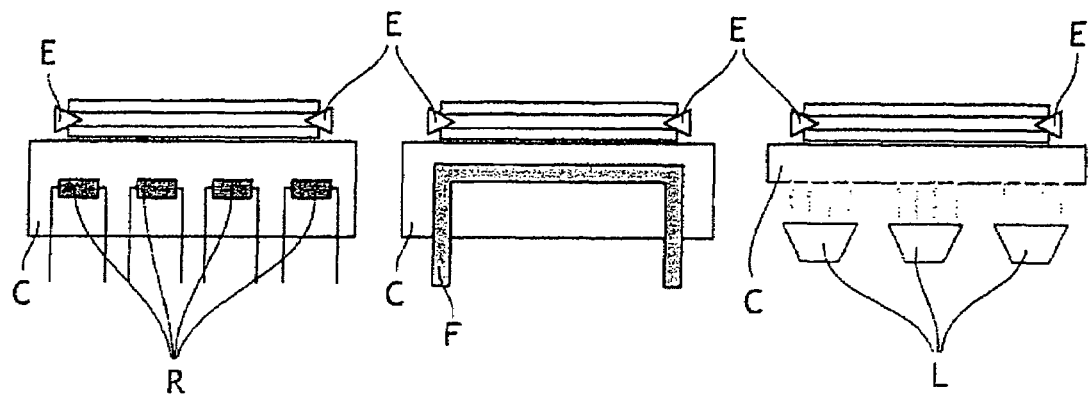
FIG. 3 represents different diagrams of equipment according to the second aspect of the invention.

A second variant of this second embodiment consists, prior to bonding, of modifying the surface state of one or both of the donor and support substrates by depositing a rough layer on one or both of the substrates. Within the scope of the example of FIG. 7, it is understood that according to this second variant steps 2 and 3 of FIG. 3 are completed at the same time by deposit of a rough layer O' on surface of the substrate A. It is required for example to deposit a TEOS layer of oxide (for example deposited by LPCVD—Low Pressure Chemical Vapor Deposition—or by PECVD—Plasma Enhanced Chemical Vapor Deposition), of a LTO layer of oxide (by chemical reaction of silane with the oxygen), or again a layer of nitride. Depositing is effected according to adapted depositing conditions, as a function of the desired final thickness, to target a certain roughness, and in particular a roughness such that the surface state limits the propagation speed of the bonding front.

By way of example, a roughness of a TEOS layer of oxide of between 2 Å RMS and 5 Å RMS limits the propagation speed of the bonding front, at the same time as retaining good bonding energy. It is specified here that the TEOS deposit is particularly adapted for the formation of ultra thin oxides (thickness less than 500 Å, or even less than 250 Å). In effect, the roughness of such deposited oxide is typically what is wanted, without requiring additional treatment. Depositing conditions helping to target adequate roughness are for example the following: pressure of between 300 mT and 700 mT; temperature of between 650° C. and 700° C. It is noted that the increase in pressure, as also the increase in temperature, results in a decrease in roughness. It is noted that this second variant is applicable both to thick deposits of oxides and for deposits of ultra thin films which subsequently undergo or not plasma activation treatment.

The invention also proposes, according to a second aspect, equipment enabling molecular adhesion of two substrates to one another. Equipment for manual bonding by molecular adhesion usually comprises a support on which is placed a first substrate, the second substrate then being returned with respect to the first substrate. The initiation of bonding (local pressure) is assured manually by means of a stylus.

Automated equipment may comprise especially:
an aligner for registering the centre and orientation of the wafer (in particular thanks to the presence of a recess known as 'notch');
one or more station(s) for surface preparation prior to bonding (operations for cleaning, rinsing, drying, etc.);
an adhesion support receiving the first substrate, then the second at the end of bonding. Spacers can likewise be provided to maintain the second substrate a few millimeters above the first before they are placed in contact;
an automatic piston ensuring initiation of bonding;
one or more loading ports receiving the cassettes of substrates to be bonded or already bonded;
a robot ensuring transport of the wafers from one element of the equipment to another.

In general, the equipment according to the second aspect of the invention reprises the classical configuration of bonding equipment by molecular adhesion (manual or automated) but further comprises means for modifying, prior to adhesion, the surface state of one or both of the substrates to be bonded. These are especially heating means for raising and controlling the temperature of one or both of the donor and support substrates before they are placed in close contact and also during being placed in close contact (that is, also during propagation of the bonding front). These heating means can dispense heat above and/or below the substrates ready to be bonded.

By way of example of devices for heating below, and in reference to FIG. 3, a 'chuck' C can be provided, forming a 'heating wafer'. This is for example a chuck in the mass whereof one or more electrical resistors R are integrated (see illustration to the left in FIG. 3), or a 'chuck' C in the mass whereof means F are integrated for circulating fluid whereof the temperature is regulated (at the centre in FIG. 3). It is likewise possible to utilize (to the right in FIG. 3) one or more heating lamps L that communicate their heat to the 'chuck' or directly illuminate the rear face of one of the substrates through a transparent plate (at least transparent to IR radiation).

It is evident that in FIG. 3 (as well as in FIGS. 4 and 5, to be mentioned hereinbelow) the donor and support substrates are shown as being opposite (typically separated by a few millimeters by spacers E), before being placed in close contact. These different techniques can be utilized separately or in combination, locally or on the whole of the chuck. It is possible to produce temperature gradients over the extent of the surfaces, or again to create local control of the temperature.

By way of example of a device enabling heating from above, an arrangement of lamps radiating directly onto on the substrates can be provided, uniformly or deliberately localized (especially where the edge voids are capable of appearing). So as to control the temperature of the heated zone (whether part or all of a substrate or the substrates) the equipment can also advantageously comprise a device for measuring the temperature in the heated zone (not shown; for example in the form of a pyrometer or a thermocouple). Equipment can also be available in a manual or automatic version.

Hereinbelow two examples are provided for using the first embodiment of the process according to the first aspect of the invention for the formation of SOI structures, within the scope of the transfer process of SMART CUTE® type. A first example is that of uniform heating of the substrates by means of a heating chuck. The different stages are the following:

preparation of the surfaces to be bonded according to humid cleaning combining RCA cleaning and treatment based on ozone;

optional plasma activation ($O_2$) of the surface of the donor substrate;

cleaning of the surfaces immediately prior to bonding, by brushing then rinsing with ultra-pure water and drying by centrifuging;

uniform heating of the substrates to be bonded by means of a heating chuck on which are placed the substrates not yet in contact but placed opposite one another and separated by a few millimeters (see FIG. 4). Heating is carried out for several seconds, according to the power of the heating device (from 1 to 90 seconds, typically 30 seconds), placing the substrates in close contact and initiation of bonding;

termination of heating.

A second example is that of localized heating at the zone where edge voids are capable of appearing, and comprises the following stages:

preparation of the surfaces to be bonded according to humid cleaning combining RCA cleaning and treatment based on ozone;

optional plasma activation ($O_2$) of the surface of the donor substrate;

cleaning of the surfaces immediately prior to adhesion, by brushing then rinsing with ultra-pure water and drying by centrifuging;

heating of the substrates to be bonded only in the zone opposite the point of initiation using a lamp L placed above the substrates not yet placed in contact but opposite one another and separated by a few millimeters (cf FIG. 5). Heating is carried out for several seconds, according to the power of the heating device (from 1 to 90 seconds, typically 30 seconds);

placing in contact and initiation of adhesion ($I_C$ localized initiation at the wafer edge); and termination of heating the wafers.

It is understood that the present invention should not be limited to the preferred embodiments previously described and that the appended claims are intended to cover the present disclosure as well as all modifications that are within the ability of a skilled artisan.

What is claimed is:

1. A method for bonding two substrates together by molecular adhesion of their surfaces which comprises: preparing the surfaces of the substrates with a flatness sufficient to facilitate bonding by propagation of a bonding front when the surfaces of the substrates are placed in contact with each other, modifying the surface of one or both of the substrates sufficiently to regulate propagation speed of the bonding front to reduce bubble or voids between the substrates after bonding, wherein the bonding front has a speed of above 0.6 and below 2 cm/s.

2. The method of claim 1, which further comprises, prior to bonding, plasma activation of one or both of the surfaces to be bonded.

3. The method of claim 1, wherein the speed of the bonding front is above 0.8 and below 1.7 cm/s.

4. The method of claim 1, wherein the modifying of the surface(s) includes decreasing water adsorbed on such surface(s).

5. The method of claim 1, which further comprises contacting the surfaces of the substrates together to effect bonding with the modified surface(s) providing a sufficiently reduced speed of the bonding from to reduce the number of bubbles or void defects therebetween compared to bonding with non-modified substrate surfaces.

6. The method of claim 1, wherein the substrates are in the form of wafers of 300 mm in diameter, and bonding is effected in an overall bonding time of between 18 and 35 seconds to avoid forming edge voids.

7. The method of claim 1, wherein one of the substrates is a donor substrate and the other substrate is a support substrate and which further comprises transferring a part of the donor substrate to the support substrate after bonding so as to form a thin layer on the support substrate.

8. The method of claim 7, wherein the donor substrate is a recycled substrate and the thin layer is defined by a zone of weakness provided in the donor substrate by implantation of atomic species.

9. The method of claim 1, wherein the modifying of the surface(s) includes roughening.

10. The method of claim 9, wherein the roughening includes forming a rough layer upon the surface(s) of the substrate(s) to be bonded by forming a thermal oxide layer on the surface of the substrate by thermal oxidation followed by etching or other chemical treatment of the oxide layer.

11. The method of claim 10, wherein the thermal oxide layer is a layer of $SiO_2$, and the chemical treatment is an SC1 treatment performed at a temperature of between 50° C. and 80° C. for a duration of longer than three to ten minutes.

12. The method of claim 9, wherein the roughening includes forming a rough layer upon the surface of the substrate to be bonded by depositing a layer of oxide or nitride thereon.

13. The method of claim 12, wherein the deposited layer of oxide is a layer of TEOS oxide, a layer of LTO oxide, or a layer of a nitride.

14. The method of claim 1, wherein surface is modified by heating applied to the surface(s) of the substrate(s) prior to being placed in contact.

15. The method of claim 14, wherein the heating is carried out for between 1 and 90 seconds at a temperature of between about 30° C. and 90° C. and is continued until the surfaces are placed into contact.

16. The method of claim 14, wherein the heating is carried out by infrared radiation at a wavelength of between 0.8 μm and 5 μm from a lamp to the substrate(s) to be heated.

17. The method of claim 14, wherein the heating is applied uniformly over the entire the surface(s) of the substrate(s) to be heated.

18. The method of claim 14, wherein the heating is applied locally at a peripheral zone of the surface(s) of the substrate(s) to be heated.

19. The method of claim 14, wherein the heating is carried out by thermal conduction via transmission of heat from a plate that supports the substrate(s) to be heated.

20. The method of claim 19, wherein the plate forms a heating wafer and comprises one or more electrical resistors integrated into the plate.

21. The method of claim 20, which further comprises circulating fluid through the plate to remove heat from the plate.

22. A method for bonding two substrates together by molecular adhesion of their surfaces which comprises: preparing the surfaces of the substrates with a flatness sufficient to facilitate bonding by propagation of a bonding front when the surfaces of the substrates are placed in contact with each other, modifying the surface of one or both of the substrates sufficiently to regulate propagation speed of the bonding front to reduce bubble or voids between the substrates after bonding, wherein adhesion of the surfaces of the substrates is initiated at the center of the substrate, and the heating is applied locally at a peripheral zone that includes the entire circumference of the surface(s) of the substrate(s).

23. A method for bonding two substrates together by molecular adhesion of their surfaces which comprises: preparing the surfaces of the substrates with a flatness sufficient to facilitate bonding by propagation of a bonding front when the surfaces of the substrates are placed in contact with each other, modifying the surface of one or both of the substrates sufficiently to regulate propagation speed of the bonding front to reduce bubble or voids between the substrates after bonding, wherein adhesion is initiated at an edge of the substrates, and the heating is applied locally at a peripheral zone that defines an arc of a circle diametrically opposed to the edge where adhesion is initiated and is limited by an angle of about 120°.

* * * * *